United States Patent [19]

Kanaoka et al.

[11] Patent Number: 4,544,259
[45] Date of Patent: Oct. 1, 1985

[54] SIDE PRINTING APPARATUS

[75] Inventors: Takeshi Kanaoka; Shigehisa Shimizu, both of Kanagawa, Japan

[73] Assignee: Fuji Photo Film Co., Ltd., Kanagawa, Japan

[21] Appl. No.: 630,278

[22] Filed: Jul. 12, 1984

[30] Foreign Application Priority Data

Jul. 13, 1983 [JP] Japan .................. 58-126117

[51] Int. Cl.$^4$ .................................. G03B 27/00
[52] U.S. Cl. ................................. 355/1; 355/40; 352/92
[58] Field of Search ............ 355/1, 40; 350/96.23, 350/96.25; 352/92

[56] References Cited

U.S. PATENT DOCUMENTS 3,029,717 4/1962 Hildebrandt .................. 355/40
3,603,974 9/1971 Copeland ..................... 355/40
3,825,336 7/1974 Reynolds ..................... 355/1

Primary Examiner—Monroe H. Hayes
Attorney, Agent, or Firm—Young & Thompson

[57] ABSTRACT

A printing apparatus for printing a colored mark in a colored dot pattern on a colored light sensitive material which is moving. A plurality of picture element display sections are aligned in a row perpendicular to the direction of movement of the colored light sensitive material, each of the plurality of picture element display sections emitting a single colored dot, and selectively emitting light to form a dot pattern. Each of the picture element display sections comprises a plurality of sources of lights of different colors, and a plurality of light guides for transmitting the respective colored lights. The outlet ends of the plurality of light guides are regularly arranged so that the light guides transmitting different colored lights are adjacent to each other, thereby mixing the different colors of lights. By changing the intensity of the light sources, a colored dot having the desired color and intensity is produced.

11 Claims, 5 Drawing Figures

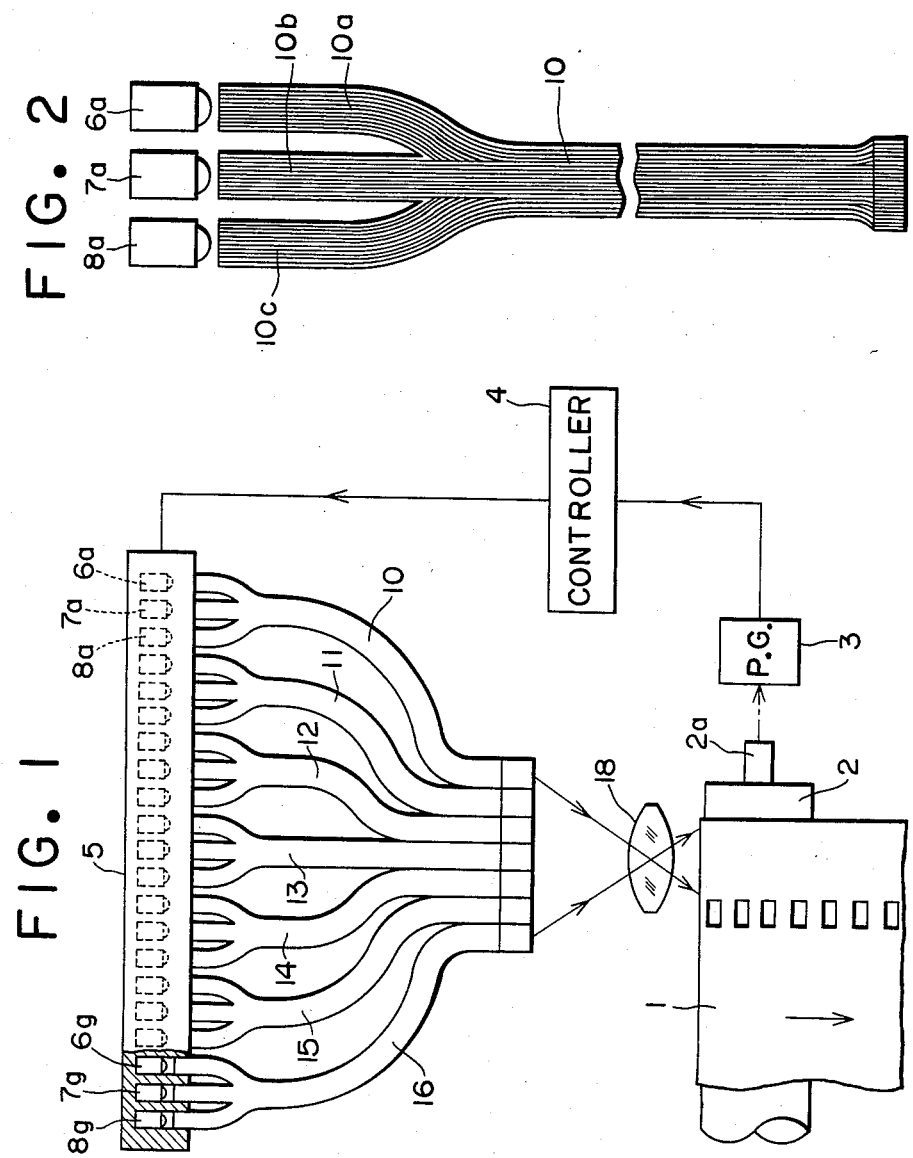

SIDE PRINTING APPARATUS

The present invention relates to a side printing apparatus which is used for printing characters or symbols (hereinafter referred to as marks) such as a manufacturer's name, the name of a type of goods, frame number, manufacturing date, production lot number or the like, on an edge portion of a color light sensitive material such as a color photographic film. More particularly, the present invention relates to an improved apparatus in which a plurality of picture element display sections, each comprising a plurality of sources of lights of different colors for emitting colored light and a plurality of light guide groups corresponding to each light source, are aligned in a row perpendicular to the direction of movement of the color photographic film, each picture element display section being selectively actuable in order to print a colored mark comprised by a colored dot pattern on the color photographic film as a latent image.

It is known in the art that a manufacturer's name or the like is printed as a latent image on a color photographic film during the manufacturing process thereof, on a film edge portion (such as an intermediate section between the perforations and the film margin). A printing of this nature is generally called a side printing, and an apparatus for use in side printing is called a side printing apparatus. Side printing apparatuses are known in the art, for example, in each of the following Japanese publications: Utility Model Publication No. 56-16589, Patent Laid-open Publication No. 57-42037 and No. 57-163226, and Utility Model Laid-open Publication No. 56-38341. These side printing apparatuses may be divided, in view of the arrangement of a light emitting apparatus for generating a mark, into those apparatuses each comprising a mark plate on which a mark is recorded and a light source such as a lamp or light emitting diode for illuminating the mark plate; those apparatuses in which a character display unit made of light emitting diodes arranged in a matrix is used; those apparatuses in which a CRT is used; and those apparatuses in which a laser light is used. Those side printing apparatuses may be further divided, according to the method of printing, into those apparatuses in which a mark is printed by moving a light emitting apparatus in synchronization with the movement of a photographic film, those apparatuses in which a mark is printed on a moving photographic film by momentarily actuating a fixed light emitting apparatus, or the like. Since the side printing apparatus described above prints a mark by using only one light source which emits a white light, a mark having various colors cannot be obtained as desired.

OBJECTS OF THE INVENTION

It is a main object of the present invention to provide a side printing apparatus which can print a colored mark having a desired color as a latent image on a colored light sensitive material.

It is another object of the present invention to provide a side printing apparatus which can print a colored mark which is uniform in hue and darkness at every point thereon.

Finally, it is an object of the present invention to provide a side printing apparatus which can readily adjust the exposed light in accordance with the film sensitivity, and can readily change the color of the colored dots.

SUMMARY OF THE INVENTION

In order to attain the above and other objects and advantages of the present invention, a picture element display section for displaying through light emission a single picture element is provided, which comprises a plurality of light sources for emitting different colored lights, and light guide groups provided for every light source. A plurality of picture element display sections are aligned in a row perpendicular to the direction of movement of a color photographic film. Each of the picture element display sections is selectively actuated during the movement of the color photographic film in order to print a colored mark thereupon. In the picture element display section, the outlet ends of the light guides belonging to different light guide groups are disposed, so as to have a regular arrangement. Thus, a colored mark comprised by colored dots is printed on a color photographic film.

The advantages of the present invention are that since plural different light sources for emitting different colored lights, and a plurality of light guides for mixing, by the color addition method, the colored lights emitted by the light sources, are employed, it is possible to side-print a colored mark having a desired color and intensity upon a colored light sensitive photographic film, by adjusting the light emission intensity of each light source. Furthermore, since current adjustment is carried out at only one position, the work operations for sideprinting a colored mark upon a film having a different property such as film sensitivity, or for changing the color of a colored dot, are readily accomplished. In addition, it is possible to eliminate variations of the drive current for each light source, and to print a colored mark having a uniform hue and darkness at every portion thereof. Moreover, since a plurality of light sources are used, the amount of light is greater than that in an apparatus using a single light source, so that the printing rate can be proportionately increased.

BRIEF DESCRIPTION OF THE DRAWINGS

FIG. 1 is a schematic view illustrating the present invention.

FIG. 2 is a side elevational view of a picture element display section shown in FIG. 1.

DETAILED DESCRIPTION OF THE INVENTION

Figure 3:
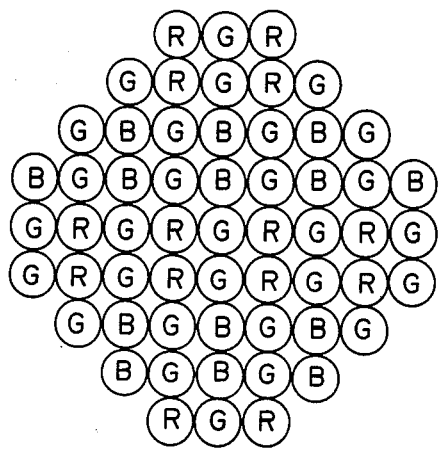
FIG. 3 is a diagram illustrating the outlet ends of the light guide means shown in FIG. 2.

In FIG. 1, there is shown a color photographic film 1 which is moved at a constant speed in the direction shown by the arrow. A print roller 2 is rotated by the contact of its outer periphery with the color photographic film 1. A pulse generator 3 is directly coupled to an axle 2a of the print roller 2. Each time the print roller 2 is rotated by the color photographic film 1 by a definite amount, the pulse generator 3 generates a pulse which is supplied to a controller 4. The controller 4 comprises a microcomputer that checks position information obtained by counting the pulses from the pulse generator 3, and emits a mark generation signal which is supplied to a light source section 5.

The light source section 5 is constructed of red color light emitting diodes 6a to 6g for emitting red colored light; green color light emitting diodes 7a to 7g for emitting green colored light; and blue color light emitting diodes 8a to 8g for emitting blue colored light. In FIG. 1, reference characters 6b to 6f, 7b to 7f, and 8b to 8f are omitted for simplification of the drawing. These light emitting diodes are divided into seven groups in total, each group including three light emitting diodes different in emission color. Light emitting diodes belonging to the same group, such as light emitting diodes 6a, 7a, and 8a are simultaneously illuminated.

Light emitted from the respective seven groups is transmitted to adjacent the color photographic film 1 through light guide means 10 to 16. The seven color dots emitted from the outlet ends of the light guide means 10 to 16 are focussed on the moving color photographic film 1. Thus, it will be seen that a picture element display section for displaying through light emission a single picture element is constructed of, for example, the groups three light emitting diodes 6a, 7a, and 8a, and light guide means 10. The seven picture element display sections are aligned in a row perpendicular to the direction the color photographic film 1 moves. When the color photographic film 1 moves by a definite distance, light emissions are brought about a predetermined number of times N. Therefore, it is possible to print one character represented by 7×N picture elements upon the color photographic film 1 as a latent image.

FIG. 2 shows a single picture element display section. The light guide means 10 are comprised by three light guide groups 10a to 10c, each light guide group including a plurality of optical fibers. The end portions of the optical fibers are bundled together and fixed with an epoxy resin to form an inlet end of each light guide group 10a to 10c. The inlet ends of the light guide groups 10a to 10c are disposed facing respectively corresponding light emitting diodes 6a, 7a, and 8a.

The outlet ends of the light guide groups 10a to 10c are shown in FIG. 3, regularly arranged and fixed with an epoxy resin such that optical fibers belonging to different light guide groups respectively are arranged adjacent to each other. In FIG. 3, R designates an optical fiber belonging to the light guide group 10a and emitting a red colored light; G designates an optical fiber belonging to the light guide group 10b and emitting a green colored light; and B designates an optical fiber belonging to the light group 10c and emitting a blue colored light. In this embodiment, three optical fibers for transmitting different colors have been arranged in a triangular shape to form a Bayer arrangement; however, it is also possible to employ other arrangements such as a checkered arrangement or the like. Furthermore, the outlet end of the light guide means is shown as of a circular configuration, but other configurations such as rectangular are also possible.

Figure 4:
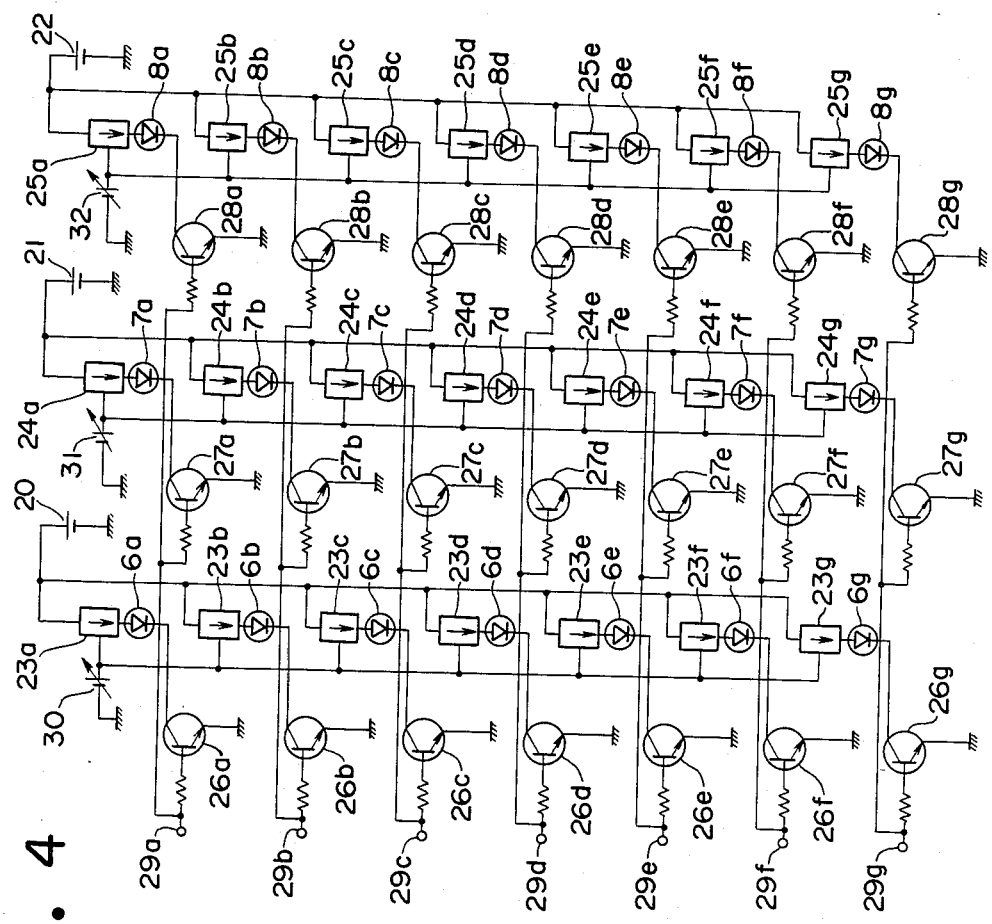
FIG. 4 is a schematic circuit diagram showing one example of a drive circuit for the light emitting diodes.

FIG. 4 shows an electric circuit for controlling the light source section. Reference numerals 20 to 22 designate power sources; 23a to 23g, 24a to 24g, and 25a to 25g designate current limiting circuits; 26a to 26g, 27a to 27g, and 28a to 28g designate transistors; 29a to 29g designate input terminals; and 30 to 32 designate variable voltage sources for current adjustment. A pulse of the mark generation signal is supplied, for example, to the input terminal 29a, then the transistors 26a, 27a, 28a are turned ON for a predetermined time thereby simultaneously to illuminate the light emitting diodes 6a, 7a, and 8a. In case the light emitting diodes 6a, 7a, and 8a have the same light emission intensity, the light radiated from the outlet end of the light guide means 10 shown in FIG. 2 is a white light. Since the light emitting diodes emitting the same colored light, for example, diodes 6a to 6g, are current controlled by a common current adjustment variable voltage source 30, the red colored light of each picture element display section is concurrently controllable. Therefore, by controlling the variable voltage source 30 to 32 for current adjustment, it is possible to obtain a desired color of colored dots displayed through light emission of the picture element display sections, with the ratio of the three components of colored lights suitably adjusted. Furthermore, it is also possible to obtain an intensity corresponding to the film sensitivity, with the three components of colored lights simultaneously increased or decreased. Furthermore, since the color and intensity displayed by each picture element display section is the same, the colored mark made visible by development and printing has a uniform hue and darkness over the entire surface thereof so that it is possible to attain a high quality colored mark.

Figure 5:
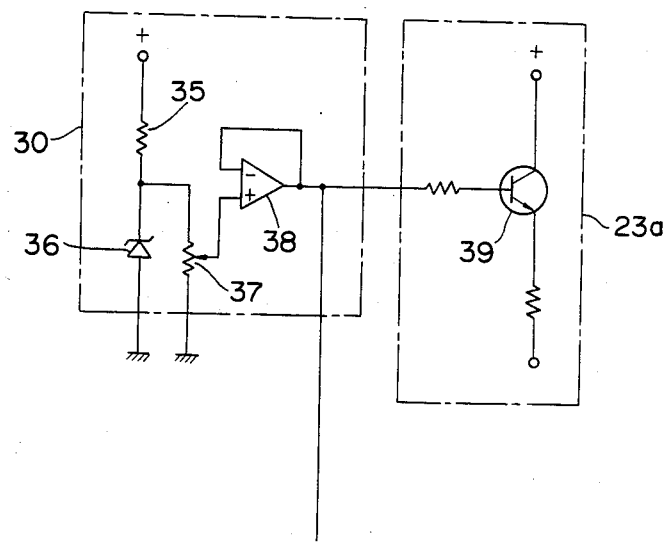
FIG. 5 is a schematic circuit diagram showing a variable voltage source for current adjustment and a current adjustment circuit.

FIG. 5 shows an embodiment of the variable voltage source for current adjustment and the current adjustment circuit. To the connection point between a resistor 35 and a zener diode 36, a potentiometer 37 is connected. The voltage set by the potentiometer 37 is delivered to each current adjustment circuit 23a to 23g through a buffer 38. The current adjustment circuit, for example circuit 23a, including a transistor 39 whose current is adjusted by varying the base-emitter voltage thereof, changes the light emission intensity of the light emitting diode 6a.

The present invention is not limited to the above described embodiment, but it is possible to make various modifications and alterations, which should be construed as falling within the scope of the present invention, such as dispensing with one of the light sources of red, green and blue.

What is claimed is:

1. In a side printing apparatus for printing a mark in a dot pattern as a latent image on a colored light sensitive material while said material is moving; the improvement comprising:
   a plurality of picture element display sections each for producing a colored dot from a plurality of which colored dots said mark is composed;
   each of said sections comprising a plurality of simultaneously actuated sources of lights of different colors, and a plurality of light guides for mixing said lights of different colors to form a said colored dot.

2. A side printing apparatus as set forth in claim 1, in which said plurality of light guides are divided into a plurality of light guide groups, each group including a plurality of light guides passing the same colored light, the plurality of light guides belonging to each light guide group having inlet ends which are bundled together and are disposed so as to receive light only from the corresponding one of said light sources, said light guides having outlet ends which are regularly arranged so that each is adjacent to the outlet end of a light guide belonging to a different light guide group.

3. A side printing apparatus as set forth in claim 2, in which said light guides are optical fibers.

4. A side printing apparatus as set forth in claim 1, in which each of said plurality of picture element display sections comprises a red light source for emitting a red colored light, a green light source for emitting a green colored light, and a blue light source for emitting a blue colored light.

5. A side printing apparatus as set forth in claim 1, in which the light sources of the same color of light provided in every said picture element display section, are electrical and are connected in parallel to each other.

6. A side printing apparatus as set forth in claim 5, further comprising light intensity adjustment means for each color of said light sources.

7. A side printing apparatus as set forth in claim 6, in which said light sources are electrical and said light intensity adjustment means controls the electric current supplied to said light sources.

8. A side printing apparatus as set forth in claim 7, in which said light intensity adjustment means comprises transistors each connected serially to a respective one of said light sources, and a variable voltage source for adjusting the respective base voltages of said transistors.

9. A side printing apparatus as set forth in claim 8, in which said variable voltage source comprises a zener diode connected to a resistor; a potentiometer connected in parallel to said zener diode; and a buffer connected to said potentiometer.

10. A side printing apparatus as set forth in claim 1, in which said light sources are light emitting diodes.

11. A side printing apparatus as set forth in claim 1, further comprising a lens disposed between said plurality of picture element display sections and said colored light sensitive material, by which lens said color dot is focussed and printed on said colored light sensitive material.

* * * * *